US006949201B2

(12) United States Patent
Conta et al.

(10) Patent No.: US 6,949,201 B2
(45) Date of Patent: Sep. 27, 2005

(54) PROCESS FOR MANUFACTURING A MONOLITHIC PRINTHEAD WITH TRUNCATED CONE SHAPE NOZZLES

(75) Inventors: Renato Conta, Ivrea (IT); Mara Piano, Chiaverano (IT)

(73) Assignee: Olivetti Tecnost S.p.A., Ivrea (Turin) (IT)

( * ) Notice: Subject to any disclaimer, the term of this patent is extended or adjusted under 35 U.S.C. 154(b) by 159 days.

(21) Appl. No.: 10/297,206

(22) PCT Filed: Jun. 4, 2001

(86) PCT No.: PCT/IT01/00285

§ 371 (c)(1),
(2), (4) Date: Dec. 4, 2002

(87) PCT Pub. No.: WO01/94117

PCT Pub. Date: Dec. 13, 2001

(65) Prior Publication Data

US 2003/0107618 A1 Jun. 12, 2003

(30) Foreign Application Priority Data

Jun. 5, 2000 (IT) .................................... TO2000A0526

(51) Int. Cl.[7] ............................ B41J 2/04; H01L 21/00

(52) U.S. Cl. ............................ 216/27; 216/41; 347/65; 438/21

(58) Field of Search ....................... 216/27, 41; 347/65; 438/21

(56) References Cited

U.S. PATENT DOCUMENTS 4,894,664 A 1/1990 Tsung Pan
6,000,787 A * 12/1999 Weber et al. ................. 347/65

FOREIGN PATENT DOCUMENTS

DE 198 36 357 A1 4/1999
EP 0 895 866 A 2 2/1999

* cited by examiner

*Primary Examiner*—Shamim Ahmed
(74) *Attorney, Agent, or Firm*—Banner & Witcoff, Ltd.

(57) ABSTRACT

A process for manufacturing a monolithic thermal ink jet printhead (40) comprising a plurality of chambers (74) and of nozzles (56), comprises steps of (206) depositing a plurality of sacrificial layers (31), of obtaining, by means of exposure and development operations, a plurality of casts (156), of (215) applying a structural layer (107), and subsequently steps of (225) removing the casts (156) and of (226) removing the sacrificial layers (31), in order to produce a plurality of chambers (74) and nozzles (56).

22 Claims, 12 Drawing Sheets

Fig. 3 (Prior Art)
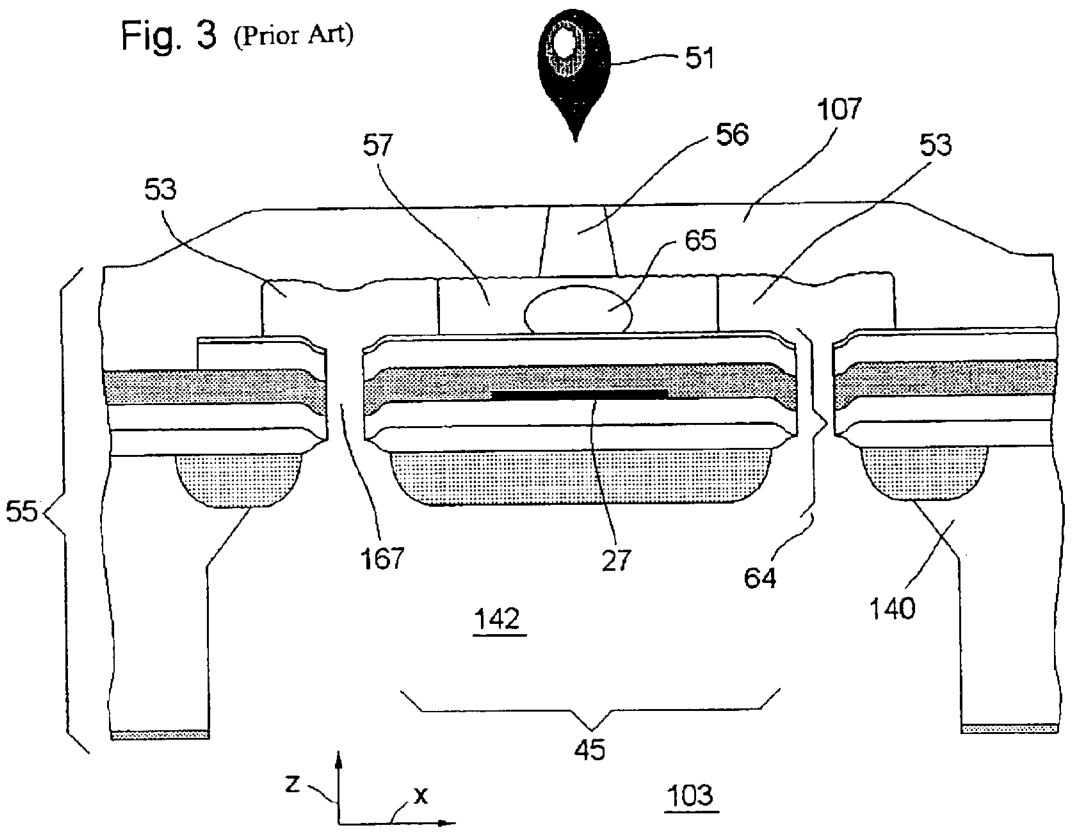
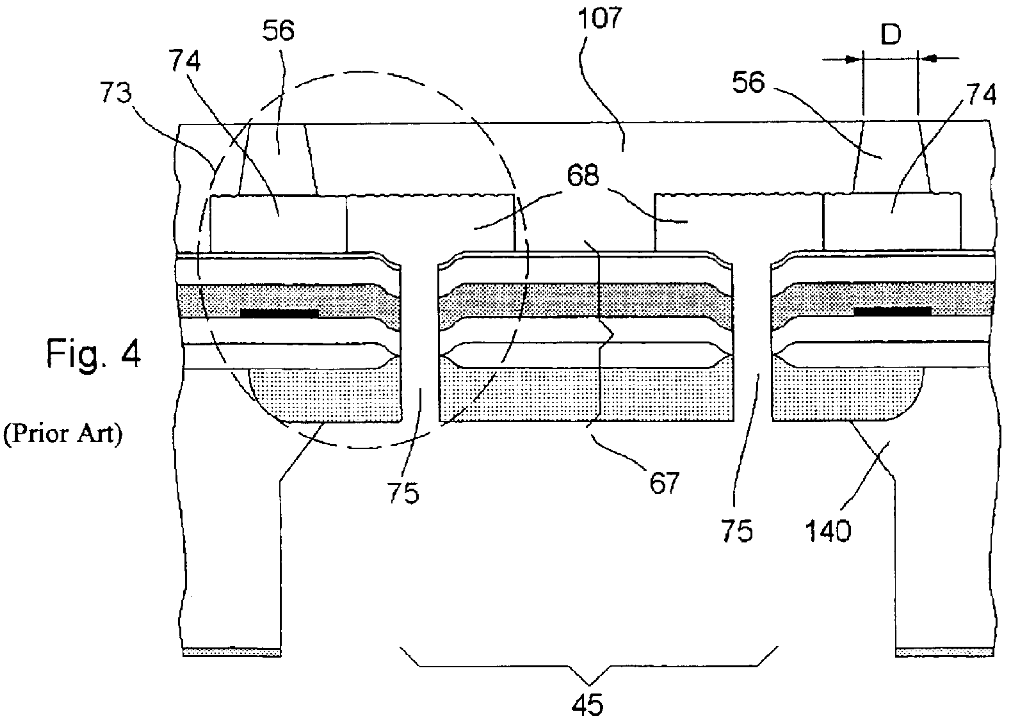
Fig. 4
(Prior Art)

cont'd at step 217 in Fig. 7 b

Cont'd from step 216 of Fig. 7 a

PROCESS FOR MANUFACTURING A MONOLITHIC PRINTHEAD WITH TRUNCATED CONE SHAPE NOZZLES

This is a U.S. National Phase Application Under 35 USC 371 and applicants herewith claim the benefit of priority of PCT/IT01/00285 filed Jun. 4, 2001, which was published Under PCT Article 21(2) in English and Application No. TO2000A000526 filed in Italy on Jun. 5, 2000.

TECHNICAL FIELD

This invention relates to a manufacturing process for a printhead used in equipment for forming, through successive scanning operations, black and colour images on a print medium, usually though not exclusively a sheet of paper, by means of the thermal type ink jet technology, and in particular to the head actuating assembly and the associated manufacturing process.

BACKGROUND ART

Depicted in FIG. 1 is an inkjet printer, on which the main parts are labelled as follows: a fixed structure 41, a scanning carriage 42, an encoder 44 and printheads 40 which may be either monochromatic or colour, and variable in number.

The printer may be a stand-alone product, or be part of a photocopier, of a "plotter", of a facsimile machine, of a machine for the reproduction of photographs and the like. The printing is effected on a physical medium 46, normally consisting of a sheet of paper, or a sheet of plastic, fabric or similar.

Also shown in FIG. 1 are the axes of reference:

x axis: horizontal, i.e. parallel to the scanning direction of the carriage 42; y axis: vertical, i.e. parallel to the direction of motion of the medium 46 during the line feed function; z axis: perpendicular to the x and y axes, i.e. substantially parallel to the direction of emission of the droplets of ink.

FIG. 2 is an axonometric view of the printhead 40, showing the nozzles 56, generally arranged in two columns parallel to the y axis, and a nozzle plate 106.

The composition and general mode of operation of a printhead according to the thermal type technology, and of the "top-shooter" type in particular, i.e. those that emit the ink droplets in a direction perpendicular to the actuating assembly, are already widely known in the sector art, and will not therefore be discussed in detail herein, this description instead dwelling more fully on some only of the features of the heads and the manufacturing process, of relevance for the purposes of understanding this invention.

The current technological trend in ink jet printheads is to produce a large number of nozzles per head (≧300), a definition of more than 600 dpi (dpi="dots per inch"), a high working frequency (≧10 kHz) and smaller droplets (≦10 pl) than those produced in earlier technologies.

Requirements such as these are especially important in colour printhead manufacture and make it necessary to produce actuators and hydraulic circuits of increasingly smaller dimensions, greater levels of precision, and narrow assembly tolerances.

These drawbacks are solved, for instance, by means of the monolithic printhead described in the Italian patent application TO 99A 000610, a section of which parallel to the plane z-x is illustrated in FIG. 3, which shows an ejector 55 comprising: a substrate 140 of silicon P, a structural layer 107, one of the nozzles 56; a groove 45; ducts 53; channels 167; and a resistor 27 which, when current passes through it, produces the heat needed to form a vapour bubble 65 which, by expanding rapidly in a chamber 57, results in emission of a droplet of ink 51. Also indicated is a tank 103 containing the ink 142.

Another solution is represented, for example, by a monolithic printhead described in the Italian patent application TO 2000A 000335, shown in sectional view in FIG. 4, which comprises the substrate 140 of silicon P, the structural layer 107, chambers 74 arranged laterally with respect to a lamina 67, on the bottom of which are located the resistors 27, which are therefore external with respect to the lamina 67. Also depicted in the figure are: the groove 45; two pluralities of elementary ducts 75, for each of which only one of the elementary ducts 75 has been drawn, which convey the ink 142 from the groove 45 to the chambers 74; and connecting channels 68. Also shown in the figure is a diameter D which the nozzle 56 presents to the outside of the printhead.

The whole comprising a chamber 74, a nozzle 56, a resistor 27, a connecting channel 68 and a plurality of elementary ducts 75 is called ejector 73.

Both the solutions also comprise a structural layer 107 in which the nozzles 56 are made using known techniques, such as for instance a laser drilling. These techniques have, however, a drawback described in the following: for the head to work properly, it is necessary for the nozzle 56 to have a truncated cone shape with the greater base towards the inside of the head, and the lesser base towards the outside. This is difficult to obtain using the above-mentioned techniques, whereas a nozzle with a truncated cone shape with the greater base towards the outside or, in the best case, a cylindrical shape nozzle is obtained commonly.

DISCLOSURE OF INVENTION

The object of this invention is to produce a monolithic printhead in which the nozzles 56 are truncated cone shape with their greater base towards the inside of the head, and the lesser base towards the outside.

Another object is to produce the nozzles in a precise, reliable, repetitive way and at low cost.

A further object is to obtain greater design freedom and a less critical photolithographic manufacturing process.

Another object is to obtain greater stability of the shape of the parts during the steps of the process which comprise heat proceedings.

These and other objects, characteristics and advantages of the invention will be apparent from the description that follows of a preferred embodiment, provided purely by way of an illustrative, non-restrictive example, and with reference to the accompanying drawings.

BRIEF DESCRIPTION OF DRAWINGS

FIG. 3—represents a section view of an ejector of a first monolithic printhead, according to the known art;

FIG. 4—represents a section view of an ejector of a second monolithic printhead, according to the known art;

BEST MODE FOR CARRYING OUT THE INVENTION

Figure 1:
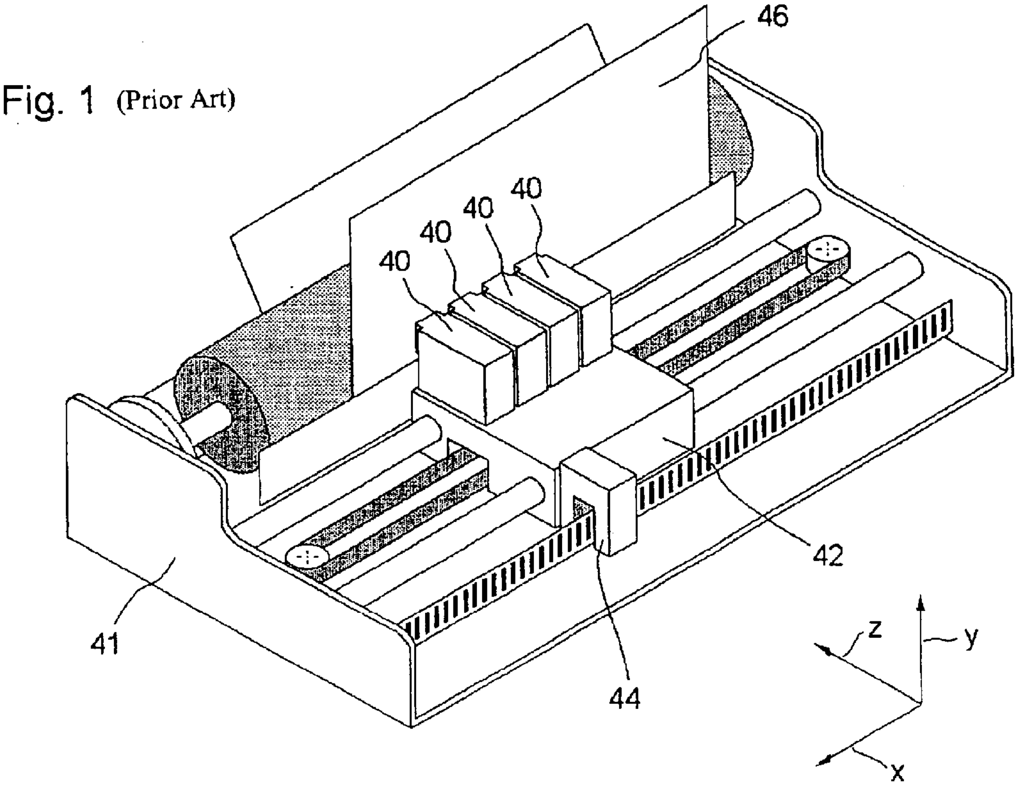
Fig. 1 (Prior Art)
FIG. 1—is an axonometric view of an ink jet printer.
Figure 2:
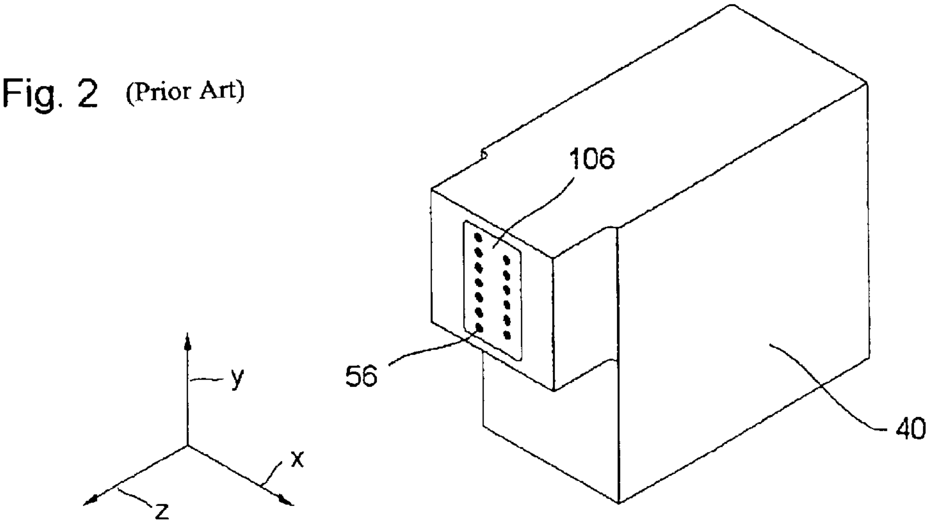
Fig. 2 (Prior Art)
FIG. 2—represents an axonometric view of an ink jet printer according to the known art.
Figure 5:
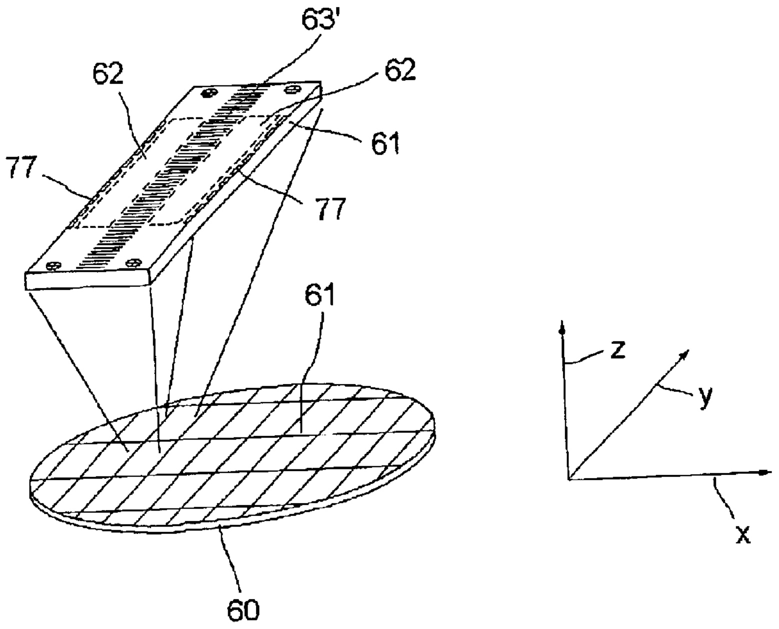
FIG. 5—represents a wafer of semiconductor material, containing dice not yet separated.

The manufacturing process of the ejectors 73 illustrated in FIG. 4 for the monolithic ink jet printhead 40 will now be described. This process initially comprises the production of a "wafer" 60, as depicted in FIG. 5, consisting of a plurality of dice 61, each of which comprises microelectronics 62, an area 63' suitable for accommodating microhydraulics 63 made up of a plurality of ejectors 55, and soldering pads 77.

In a first part of the process, not described as it is not essential for the understanding of this invention, when all the dice 61 are still joined in the wafer 60, the microelectronics 62 are produced and at the same time, using the same process steps and the same masks, the microhydraulics 63 of each die 61 are produced in part.

Figure 6:
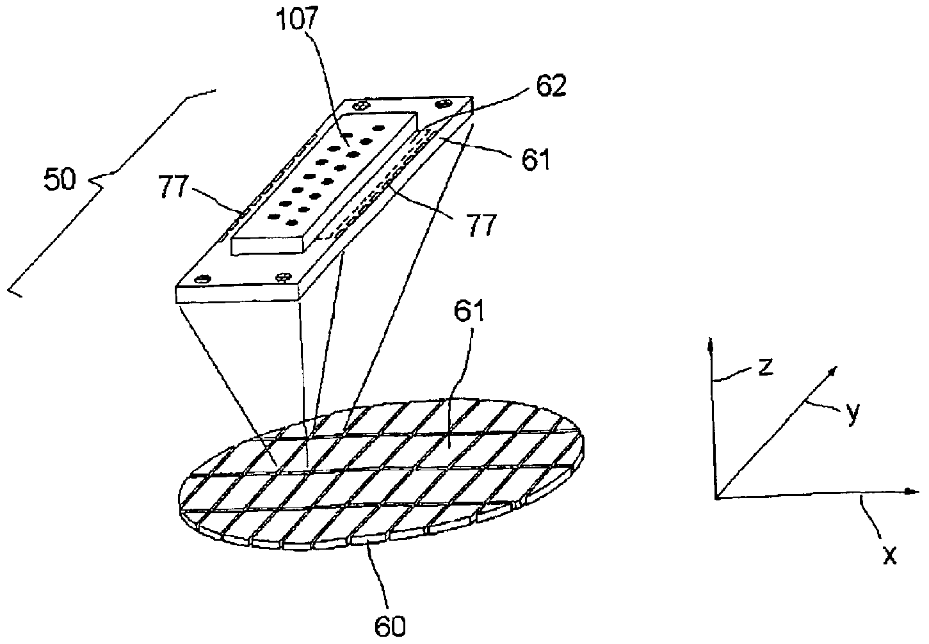
FIG. 6—represents the wafer of semiconductor material, in which the dice have been separated.

In a second part of the process, on each of the dice 61 still joined in the wafer 60, the structural layers 107 are produced and the microhydraulics 63 completed by means of operations compatible with the first part of the process. At the end of the process, the dice 61 are separated by means of a diamond wheel: the whole made up of a die 61 and a structural layer 107 thus comes to constitute an actuator 50, as can be seen in FIG. 6.

Figure 7A:
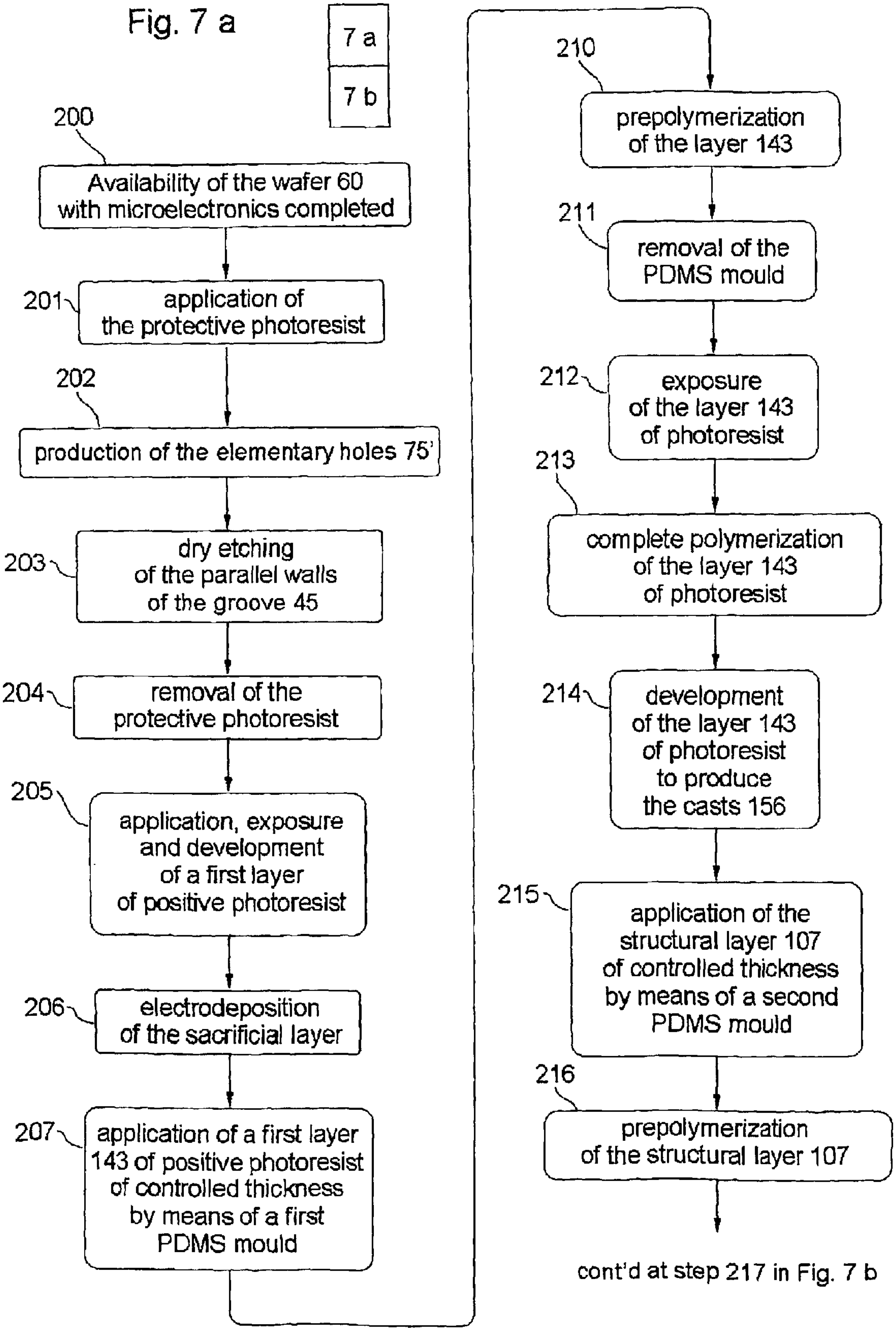
FIGS. 7*a* and 7*b*—illustrate the flow of the operations in the manufacturing process according to the invention of the ejector of FIG. 4.
Figure 7B:
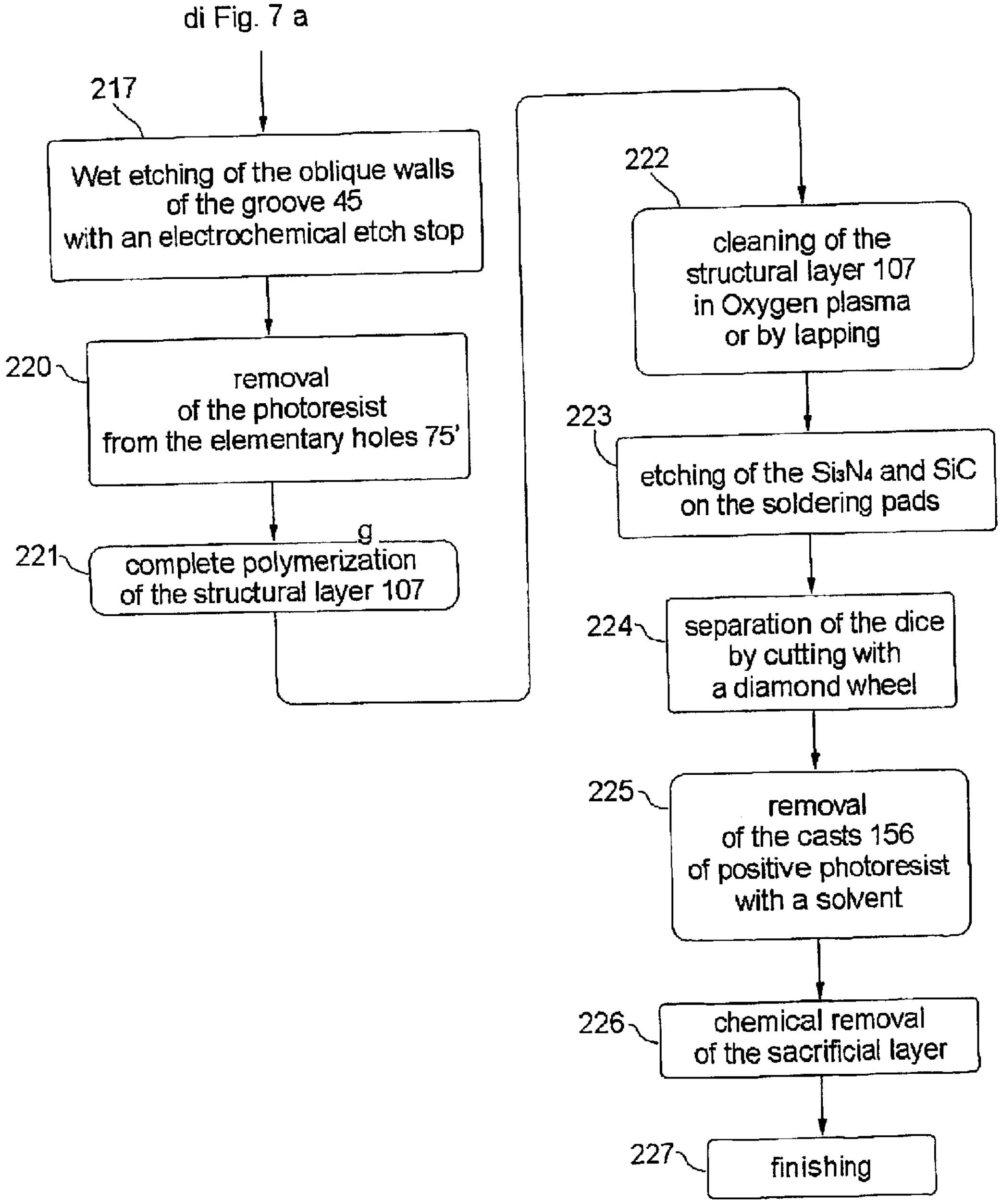

The second part of the manufacturing process is described with the aid of the flow diagram of FIG. 7*a* and FIG. 7*b*. The following steps, numbered from 200 to 206, have already been described in the cited Italian patent applications TO 99A 000610 and TO 2000A 000335, to which reference should be made in relation to the production details of single steps. The description that follows contains only the information needed for comprehension of the innovative aspects of this invention.

In a step 200, a silicon wafer 60 is available as it is at the outcome of the first part of the process, comprising a plurality of dice 61 having their microelectronics 62 finished, protected by the protective layer 30 of $Si_3N_4$ and SiC upon which the conducting layer 26 is deposited, and arranged for the successive operations in the areas of microhydraulics 63' suitable for production of the plurality of ejectors 73 constituting the microhydraulics 63.

Figure 8:
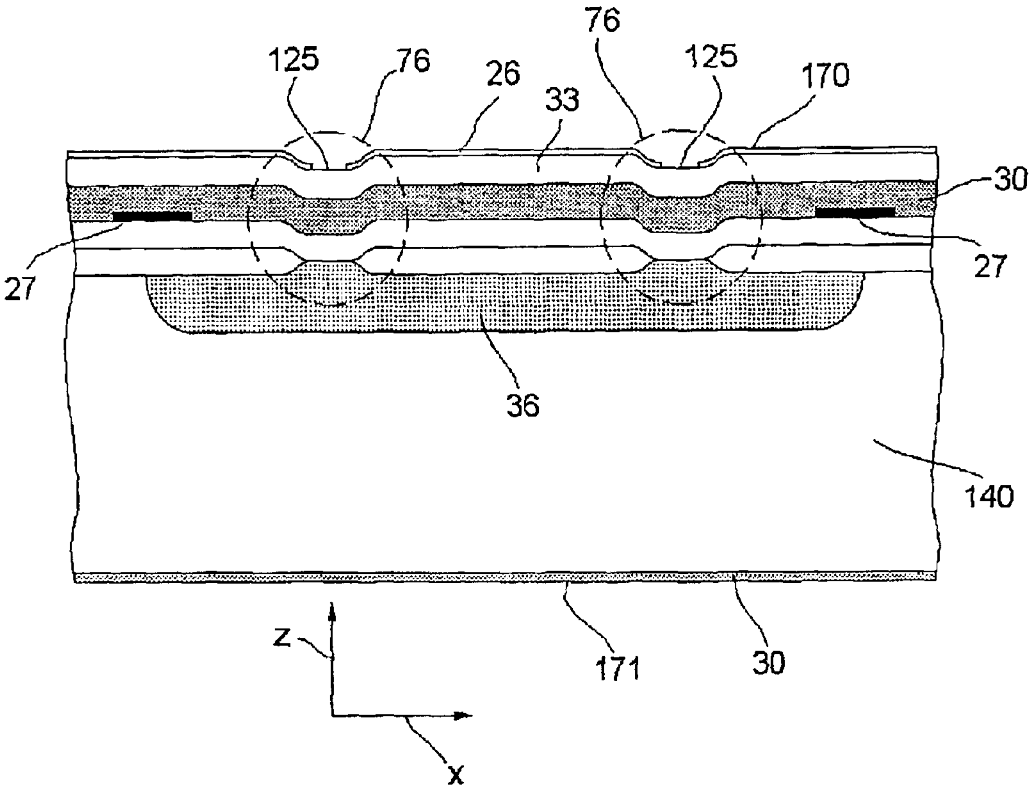
FIG. 8—illustrates a section of the ejector of FIG. 4 at the start of the manufacturing process.

FIG. 8 depicts a zone of the printhead intended to accommodate the ejectors 73, as it is in this step, in which the following are indicated: a substrate 140 of silicon P, a protective layer 30 of $Si_3N_4$ and SiC, an "interlayer" 33 of $SiO_2$ TEOS, a conducting layer 26, an N-well layer 36 and regions 76 arranged for subsequent drilling, in correspondence with each of which the conducting layer 26 presents apertures 125 having the same shape as the planned elementary ducts 75 will have to have. Also indicated are an upper face 170 and a lower face 171.

Figure 9:
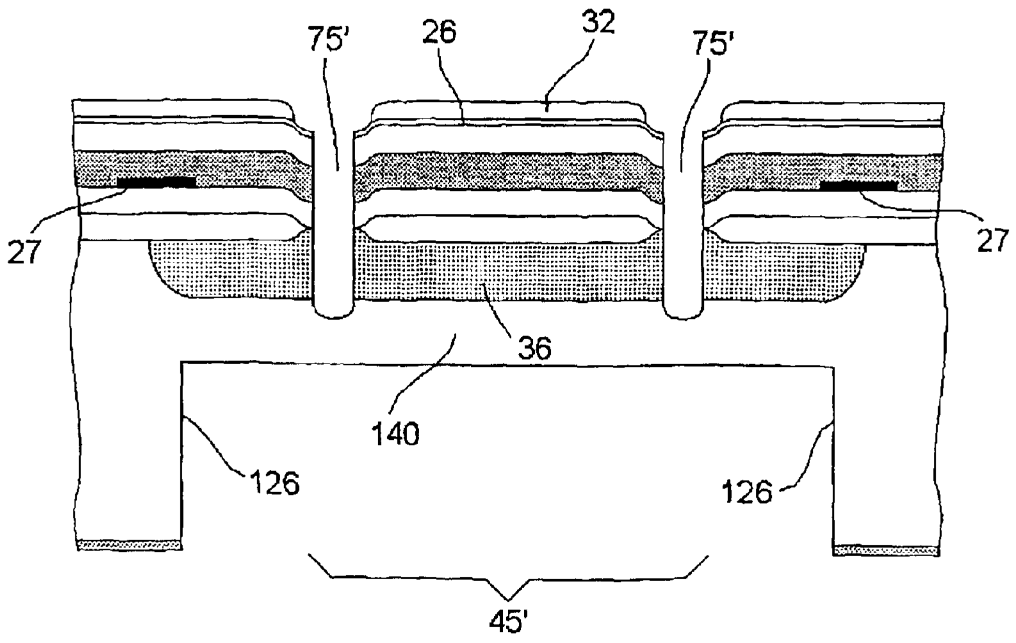
FIG. 9—illustrates a section of the ejector of FIG. 4 in a successive phase of the manufacturing process.

FIG. 9 represents the zone of the ejectors 73, as it will appear at the end of the next steps 201, 202 and 203.

In a step 201, a protective photoresist 32 is applied on top of the layer 26, in order to protect the whole wafer 60 in the successive operations. Voids are made in the protective photoresist 32 by means of known techniques, to leave the apertures 125 uncovered.

In a step 202, using as the mask the conducting layer 26, elementary holes 75' are made in correspondence with the apertures 125, for instance by means a "dry etching" technology of the ICP ("Inductively Coupled Plasma") type, for example, known to those acquainted with the sector art. The holes 75' are blind holes and partially enter into the substrate 140.

In a step 203, etching is started of the groove 45, again using ICP technology for instance. The portion of the groove 45 made in this stage, indicated as 45', presents two walls 126 substantially parallel to the plane y-z, and reaches a distance of between 100 and 150 μm, for example, from the N-well layer 36.

Figure 10:
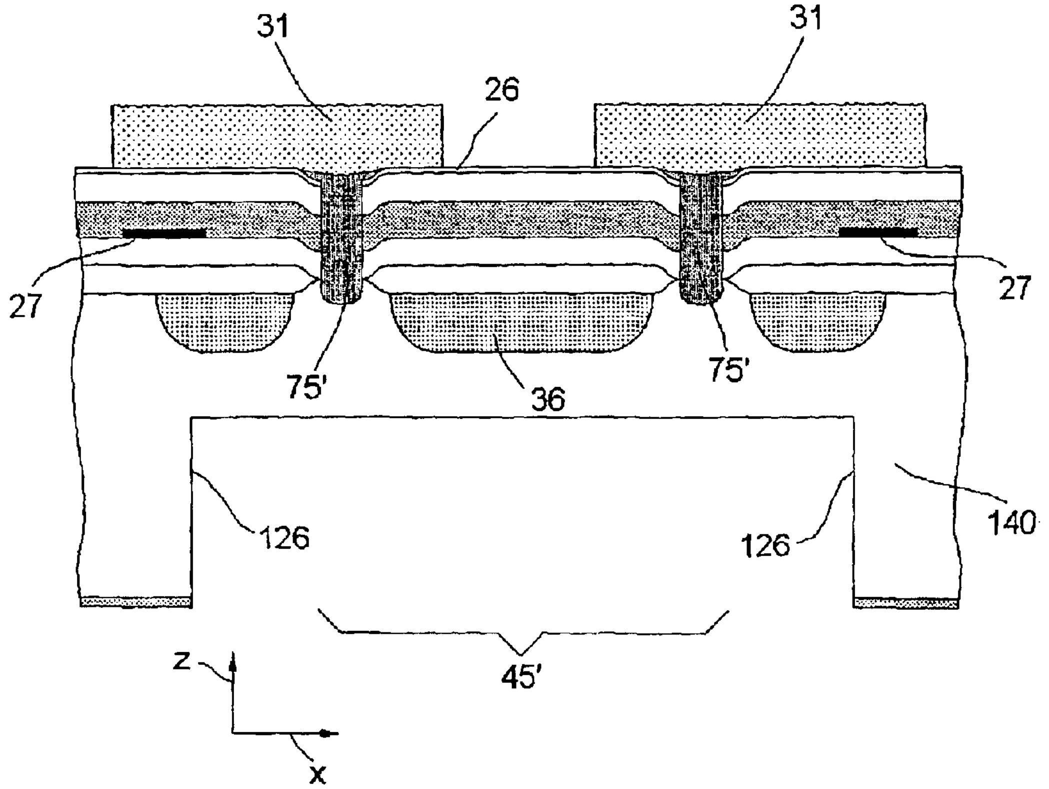
FIG. 10—illustrates a section of the ejector of FIG. 4 in another phase of the manufacturing process.

FIG. 10 represents the area of the ejectors 73, as it will appear at the end of the next steps 204, 205 and 206.

In a step 204, the protective photoresist 32 is removed.

In a step 205, on the conducting layer 26 and inside the elementary holes 75', a first layer is applied of positive photoresist of a thickness equal to the height that the chambers 74 will have, by means for instance of a centrifuge in a process known as "spinner coating". With a mask not shown in any of the figures, the photoresist is exposed to ultraviolet radiation only in correspondence with windows having the shape of that section parallel to the plane x-y which the future chambers 74 and the future connecting channels 68 will have. Intensity of the ultraviolet radiation is regulated such that the positive photoresist is depolymerized only as far as the conducting layer 26, but not inside the elementary holes 75'. Finally development is effected, during which the portion of depolymerized photoresist is removed, leaving in this way cavities having the shape of the future chambers 74 and of the future connecting channels 68, whereas the elementary holes 75' are still filled with the positive photoresist, indicated with the shading, which has remained polymerized as it has not been reached by the ultraviolet radiation.

By performing the operations in the order indicated, the advantage is obtained of effecting this step while the groove 45' and the holes 75' are not in communication, as they are separated by a layer of silicon of a thickness between, for instance, 100 and 150 μm, and it is therefore not necessary to fill the groove 45' with a temporary layer protecting the area in which development of the positive photoresist takes place.

In a step 206, electrodeposition is performed of a metal, for example copper, gold or nickel, inside the cavities produced in the step 203, in order to form the sacrificial layers 31, having the shape of the future chambers 74 and of the future connecting channels 68. The positive photoresist which fills the elementary holes 75' enables an outer surface of the sacrificial layer 31 of greater flatness to be obtained.

Figure 11:
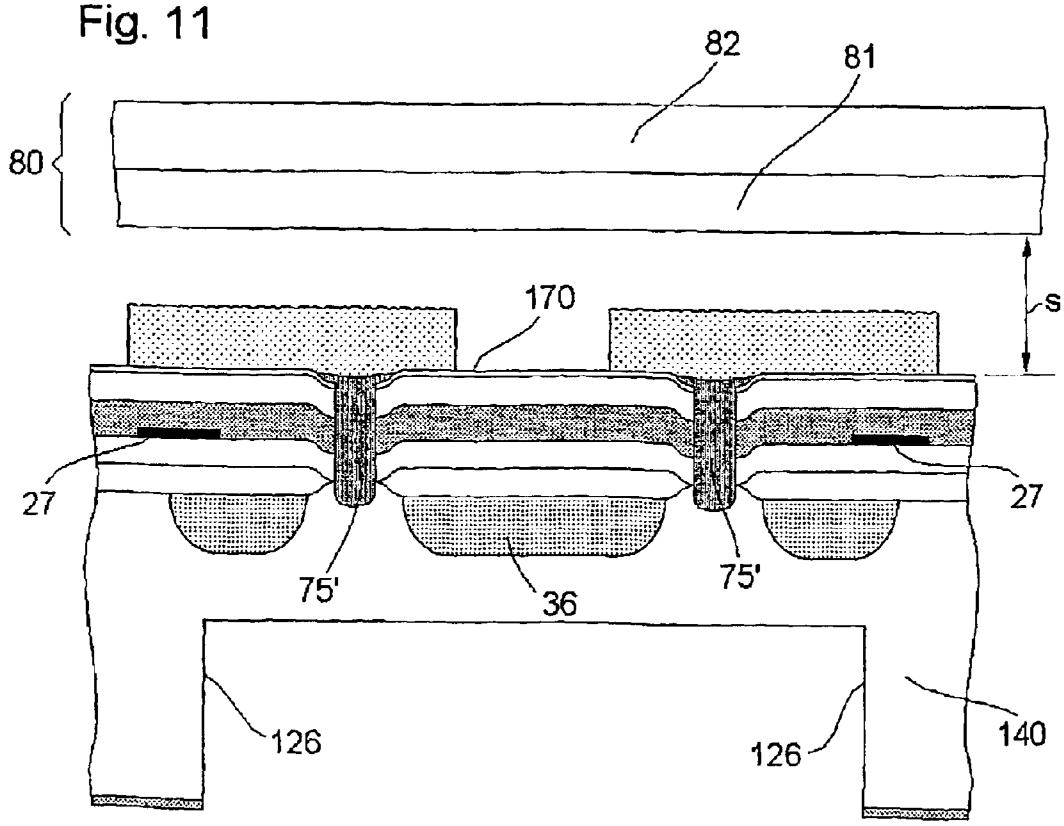
FIG. 11—illustrates a section of the ejector of FIG. 4 and of a first PDMS mould in another phase of the manufacturing process.
Figure 12:
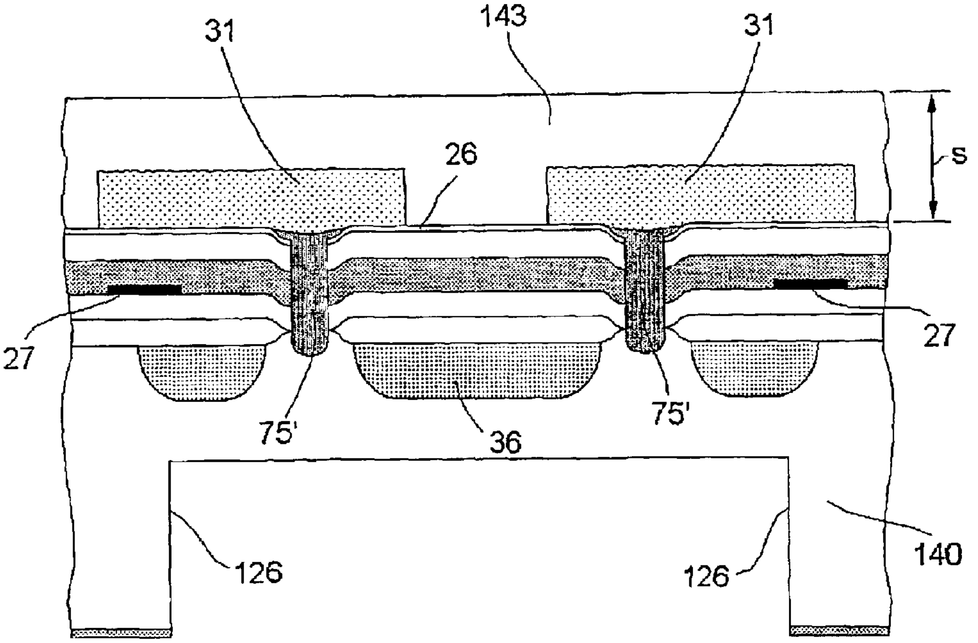
FIG. 12—illustrates a section of the ejector of FIG. 4 in a further phase of the manufacturing process.

In a step 207, on the upper face 170 which contains the sacrificial layers 31, a second layer 143 is applied of positive photoresist, for instance of the type AZ 4903 by Hoechst or SPR 220 by Shipley, having a thickness s preferably between 10 and 30 $\mu$m, as shown in FIG. 12. The layer 143 could be applied by means of a known "spinner coating" process, but its thickness s would not be controlled with precision and its outer surface would not be flat because it would follow in part the profile of the sacrificial layers 31. To obtain a flat surface and a controlled thickness s of the layer 143, the positive photoresist is applied with the aid of a first mould 80 of PDMS silicon rubber, a partial section of which is shown in FIG. 11, in which a layer 81 of silicon rubber and a support layer 82 of glass or metal can be seen.

The first mould 80 is fixed in such a way as to define an interspace of thickness s with the upper face 170 of the die 61, by means of references not shown in the figure, as these are not essential for understanding of the invention.

Use of the PDMS mould is known to those acquainted with the sector art having been described, for example, in the article "Fabrication of glassy carbon Microstructures by soft Lithography" published in the magazine Sensors and Actuators N° A72 (1999) and in the article "Wafer-Level In-Registry Microstamping" published in the IEEE magazine Journal of Microelectromechanical Systems, vol. 8, N° 1, March 1999.

So that the positive photoresist fills the PDMS mould 80 uniformly and completely by capillarity, reaching the most hidden recesses and avoiding air inclusions, it must necessarily have a low viscosity and must, where possible, be applied in a vacuum (pressure of a few mm of Hg).

In a step 210, a prepolymerization of the layer 143, called "soft bake" by those acquainted with the sector art, is performed with a very slow rise in temperature, in order to permit a gradual elimination of the solvent.

In a step 211, the PDMS mould 80 is removed.

Figure 13:
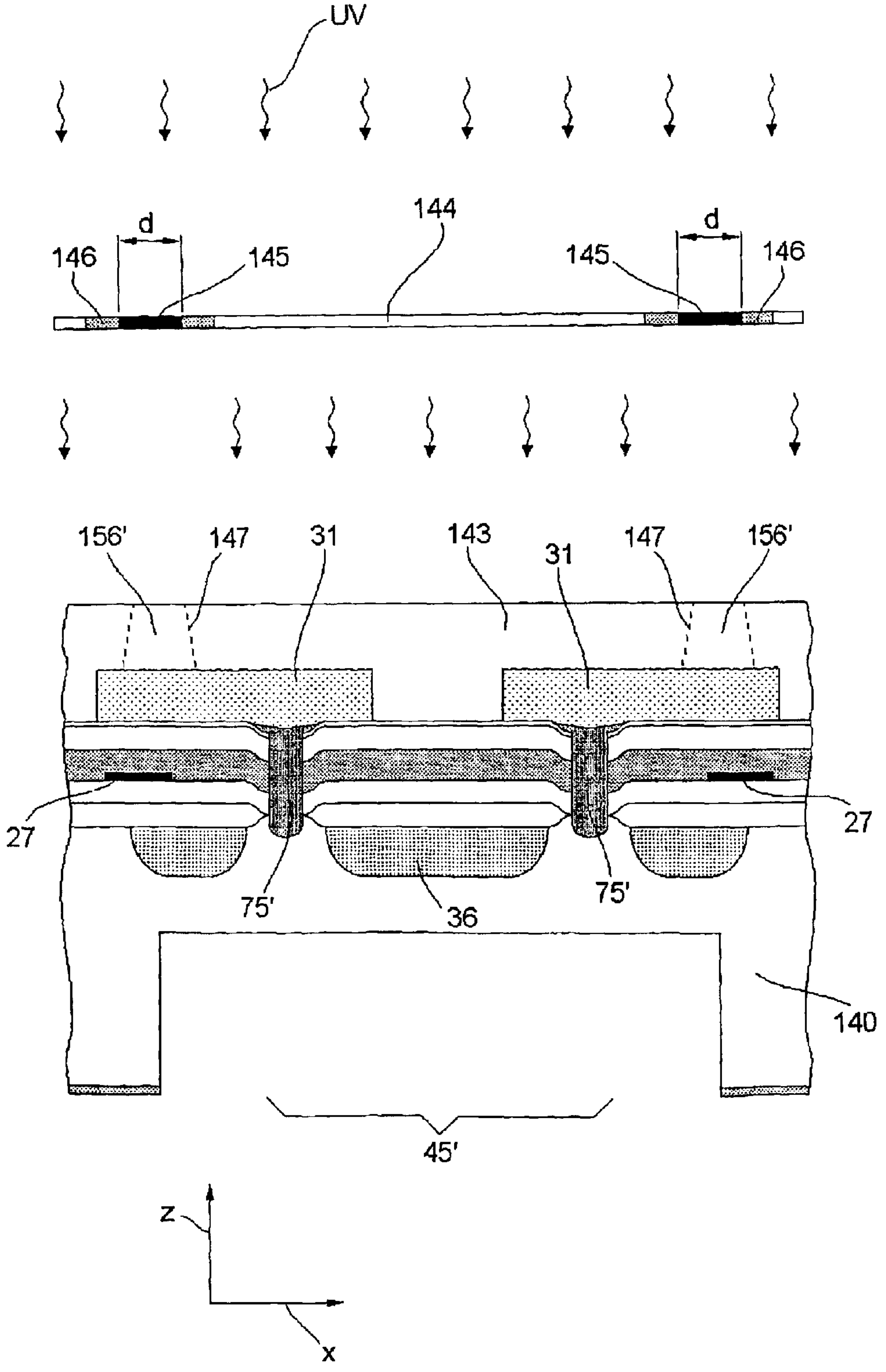
FIG. 13—illustrates a section of the ejector of FIG. 4 and of a mask in a further phase of the manufacturing process.

In a step 212, exposure of the layer 143 of positive photoresist is performed by means of ultraviolet radiation (UV) and a mask 144, as can be seen in FIG. 13. Covers 145 in the mask, opaque to the ultraviolet radiation, are aligned with the resistors 27, have a generally though not exclusively round shape, and have diameter d substantially equal to the diameter D of the future nozzles 56.

During this operation, portions 156' of the layer 143, which do not receive the ultraviolet radiation, remain polymerized, bound off by a transition surface 147. The portions 156' must take on a truncated cone shape equal to that of the future nozzles 56, having their greater base towards the inside of the head and their lesser base towards the outside. If the covers 145 have distinct edges, the ultraviolet radiation undergoes diffraction at the edges, rendering gradual the depolymerization of the positive photoresist local to the transition surfaces 147, which accordingly assume a truncated cone shape, though this is however rarely identical to the shape designed. To obtain a truncated cone shape identical to the design shape, it is usually necessary to add grey areas 146 in the mask 144 around the covers 145, which partially and in a predefined way intercept the ultraviolet radiation, in order to graduate in a controlled manner the depth of the action of the ultraviolet radiation and obtain the truncated cone shape desired.

In a step 213, a complete polymerization, called "post-bake" by those acquainted with the sector art, is performed of the layer 143 in order to render the transition surfaces 147 better defined.

Figure 14:
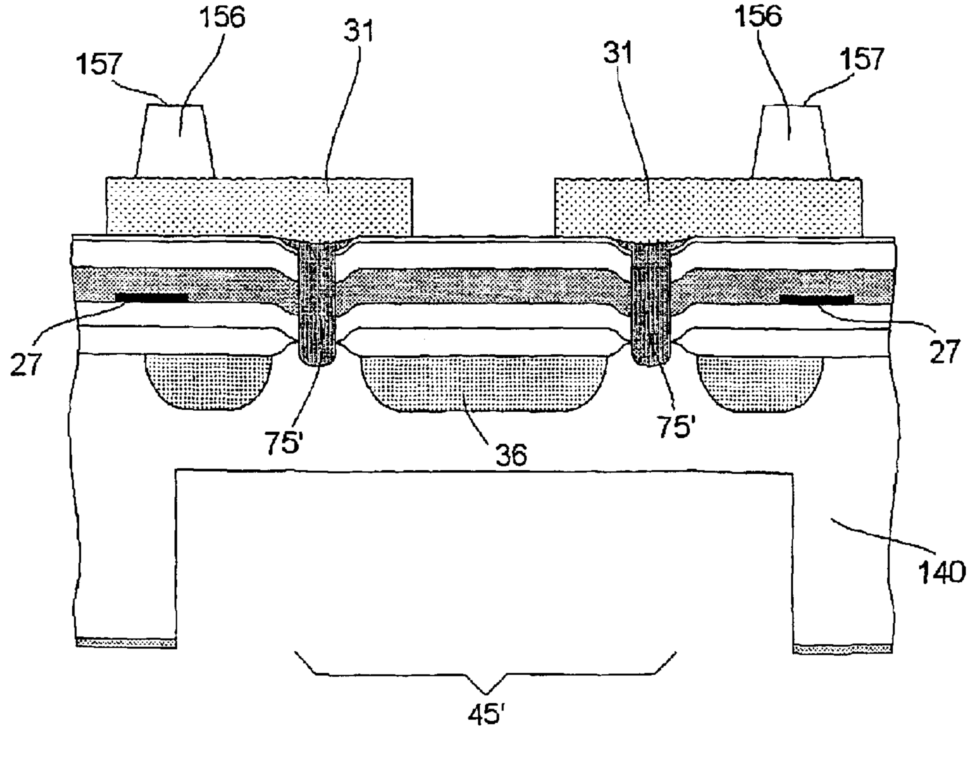
FIG. 14—illustrates a section of the ejector of FIG. 4 in a further phase of the manufacturing process.

In a step 214, development of the layer 143 is performed, as can be seen in FIG. 14. The depolymerized part of the positive photoresist is removed from the layer 143. Casts 156 adhering to the sacrificial layers 31, having an outer face 157 and a shape equal to that of the future nozzles 56, are left after this operation.

Figure 15:
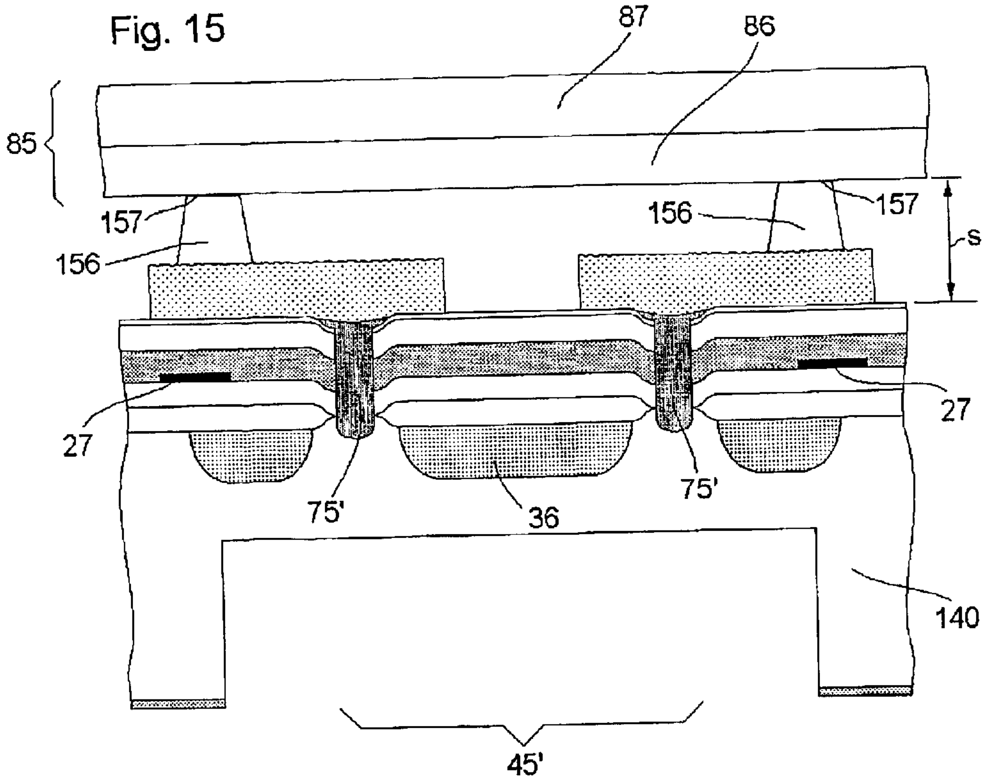
FIG. 15—illustrates a section of the ejector of FIG. 4 and of a second PDMS mould in a further phase of the manufacturing process.
Figure 16:
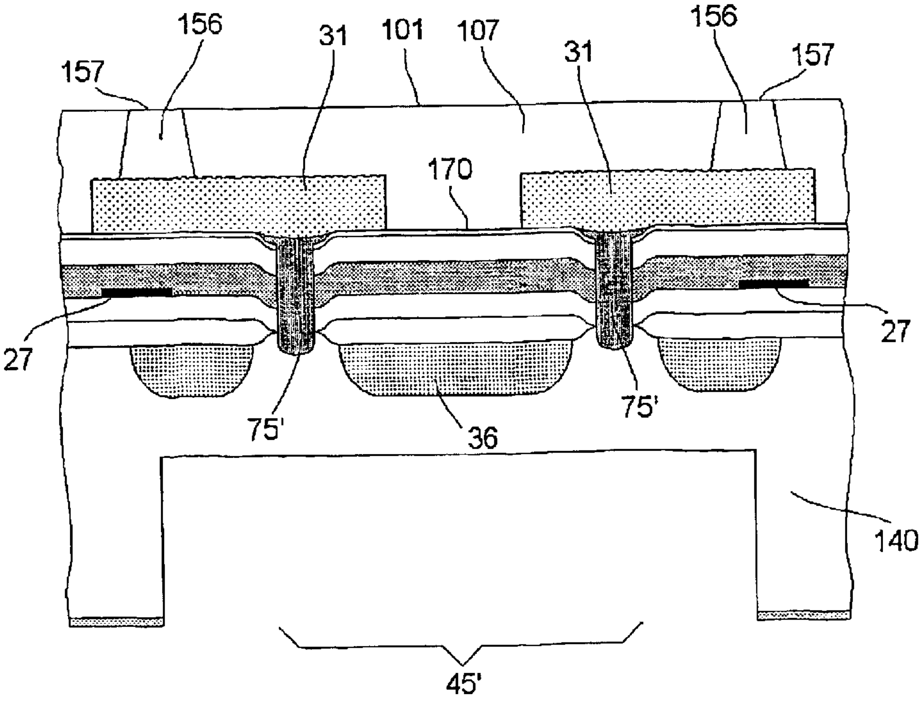
FIG. 16—illustrates a section of the ejector of FIG. 4 in a further phase of the manufacturing process.

In a step 215, the structural layer 107 shown in FIG. 16 is applied on the upper face 170 which contains the sacrificial layers 31 and the casts 156. It has an outer surface 101 and is made of a compound polymer, for example, an epoxy resin or a mix of epoxy resin and methacrylates. To obtain a flat outer surface 101 and a controlled thickness of the structural layer 107, the polymer is applied using a second PDMS silicon rubber mould 85, known to those acquainted with the sector art, a partial section of which is shown in FIG. 15 in which a layer 86 of silicon rubber and a support layer 87 of glass or metal can be seen.

The second mould 85 is put in contact with the outer face 157 of the casts 156, and defines an interspace of thickness s with the upper face 170 of the die 61: in this way, the outer surface 101 is co-planar with the outer face 157 of the casts 156.

In a variant of this step 215, the second mould 85 coincides with the first mould 80 used in the step 207, as in both steps the same interspace of thickness s is defined with the upper face 170 of the die 61.

So that the polymer fills the PDMS mould uniformly and completely by capillarity, reaching the most hidden recesses and avoiding air inclusions, it must necessarily have a low viscosity and must, where possible, be applied in a vacuum (pressure of a few mm of Hg).

In a step 216, prepolymerization of the layer 107 is performed by means, for instance, of heating between 60° C. and 80° C., with a very slow rise in temperature, the purpose of which is to liberate the gaseous products of the polymerization.

Figure 17:
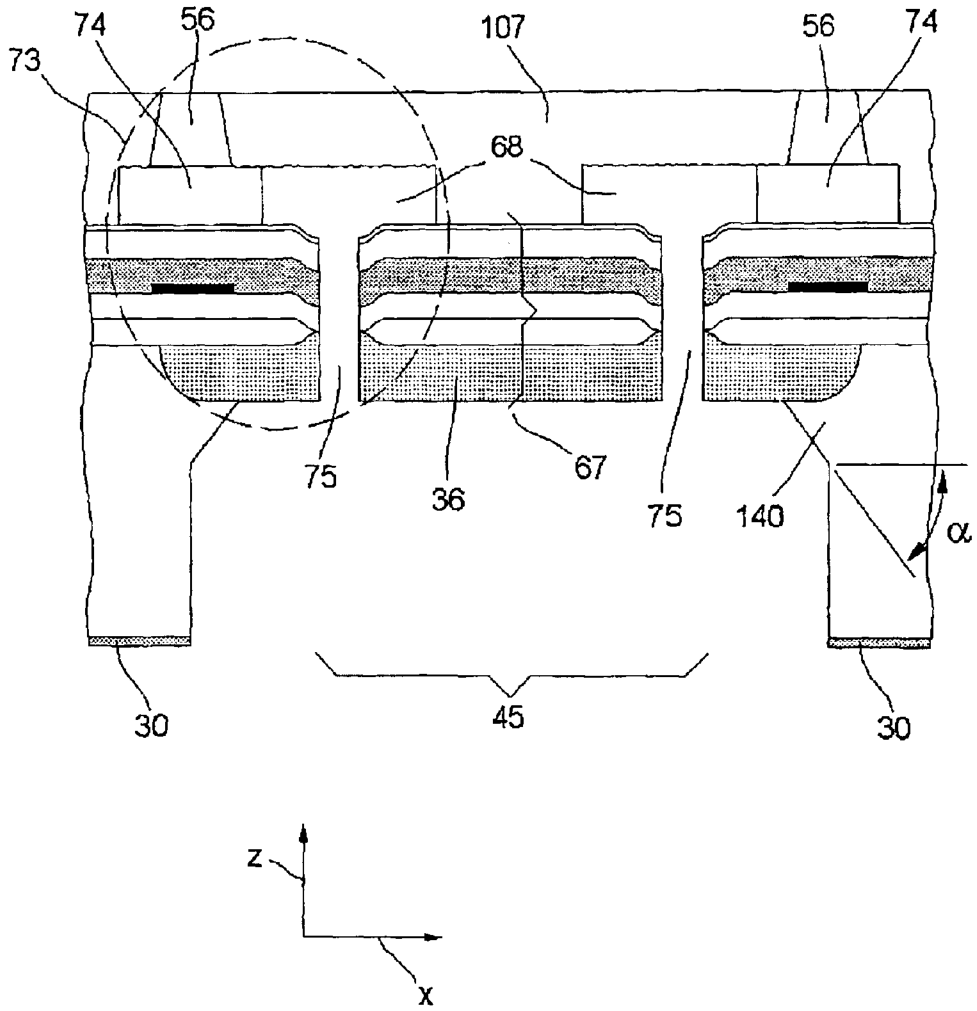
FIG. 17—illustrates a section of the ejector of FIG. 4 at the end of the manufacturing process.

The steps that follow are described with reference to FIG. 17, which represents a section parallel to the plane z-x of the head according to the invention, as it will appear at the end of the manufacturing process.

In a step 217, etching of the groove 45 is completed by means of a "wet" type technology using, for example, a KOH (Potassium Hydroxide) or TMAH (Tetrametil Ammonium Hydroxide) bath, as is known to those acquainted with the sector art. Etching of the groove 45 is conducted according to geometric planes defined by the crystallographic axes of the silicon and accordingly forms an angle $\alpha$=54.7°. The etching is stopped automatically when the N-well layer 36 is reached by means of a method, called electrochemical etch stop, known to those acquainted with the sector art. At the end of this operation, the groove 45 is delimited by the lamina 67, and the holes 75' are through holes, their blind bottom having been removed.

In a step 220, the photoresist is removed from the holes 75', in such a way as to obtain the elementary ducts 75.

In a step 221, a complete polymerization is performed of the structural layer 107 by means, for instance, of heating to a temperature of between 80 and 100° C. lasting for a few hours.

In a step 222, the surface 101 of the structural layer 107 is cleaned with, for instance, an oxygen plasma process, for the purpose of removing any residues of the layer 107 which could partially or totally cover the casts 156, so that the outer faces 157 are clean. Alternatively a lapping operation may be performed.

In a step 223, etching is performed of the protective layer 30 of $Si_3N_4$ and SiC in correspondence with the soldering pads, not shown in any of the figures.

In a step 224, the wafer 60 is cut into the single die 61 by means of a diamond wheel, not shown in any of the figures.

In a step 225, the casts 156 of positive photoresist are removed by means of a bath in a solvent suitable for the photoresist itself and which does not eat into the structural layer 107. Turnover of the solvent may be stimulated by using ultrasound agitation or a spray jet. When this operation is completed, the nozzles 56 are obtained, shaped exactly like the casts 156.

In a step 226, the sacrificial layer is removed by means of a chemical process. The cavities left empty by the sacrificial layer thus come to form the chambers 74 and the connecting channels 68.

The technology described from step 205 to step 226 is known to those acquainted with the sector art, as it is employed in the production of MEMS/3D (MEMS: Micro Electro Mechanical System).

Finally, in a step 227, the finishing operations, known to those acquainted with the sector art, are performed:

- soldering of a flat cable on the dice 61 in a TAB (Tape Automatic Bonding) process, for the purpose of forming a subassembly;
- mounting of the subassembly on the container of the head 40;
- filling with ink 142;
- testing of the finished head 40.

The step 206, electrodeposition of the sacrificial layer 31, and the step 217, wet etching of the oblique walls of the groove 45 with an electrochemical etch stop, require operations performed by means of electrochemical processes, during which specific layers belonging to all the dice 61 of the wafer 60 and, where applicable, all the segments into which the dice 61 are subdivided must be put at the same electrical potential.

This may be done advantageously as described in the Italian patent application TO 99A 000987, which is incorporated herein.

Figure 18:
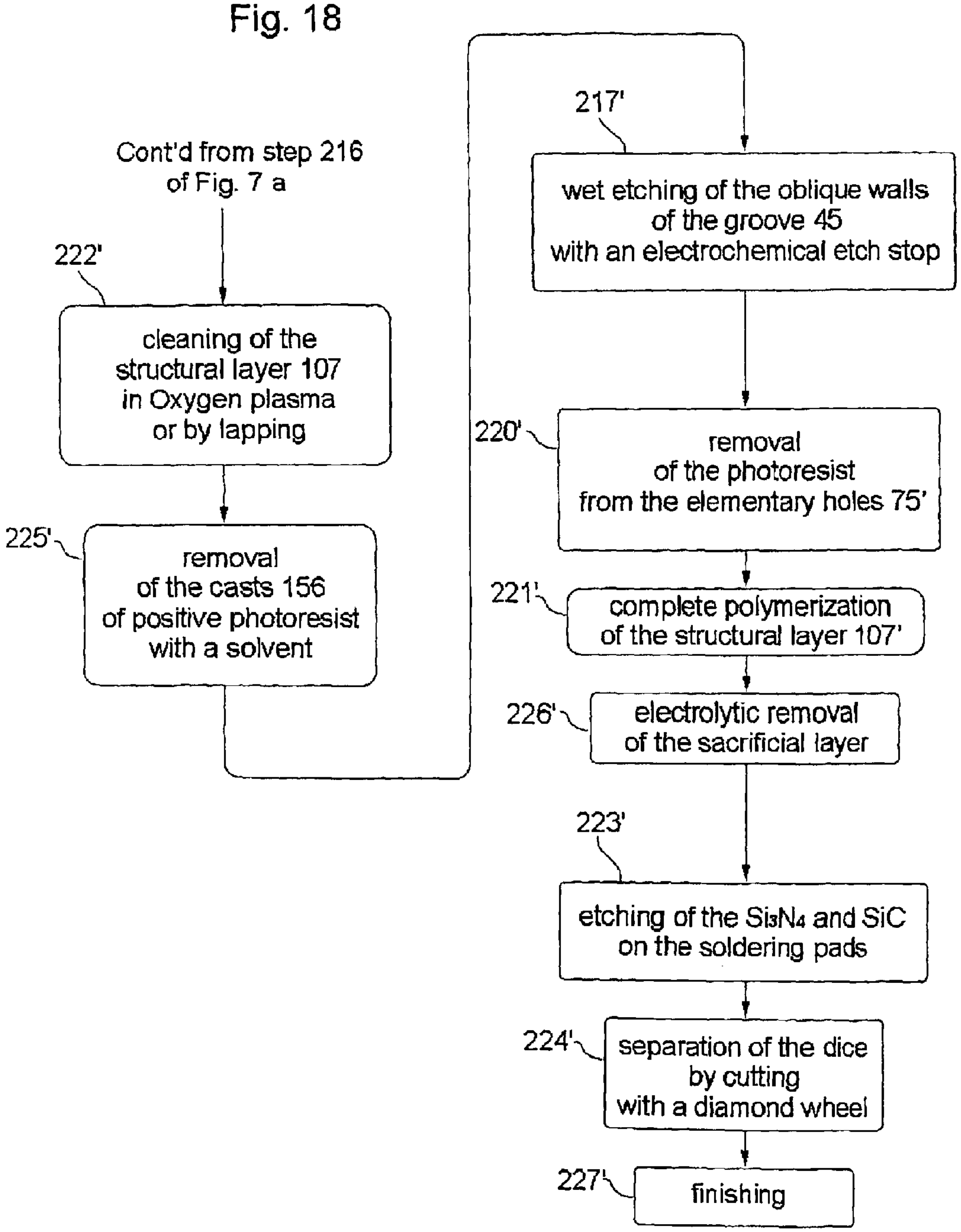
FIG. 18—illustrates the flow of the operations in a second embodiment of the manufacturing process of the ejector of FIG. 4.

Second embodiment—In a second embodiment, the steps from 207 to 216 inclusive are carried out in the same order as already described for the preferred embodiment, whereas the steps from 217 to 227 are carried out in an order indicated below, with the aid of the flow diagram in FIG. 18. The different steps correspond to those already described in relation to the preferred embodiment, and accordingly are designated with the same numerals followed by a single inverted comma.

After the step 216, the step 222' is carried out, in which cleaning is performed of the surface 101 of the structural layer 107, for example with an oxygen plasma process, or a lapping operation.

In a step 225' the casts 156 of positive photoresist are removed by means of a solvent bath. On completion of this operation, the nozzles 56 are obtained.

In a step 217', etching of the groove 45 by means of the wet technology is completed. On completion of this operation, the groove 45 is bound off by the lamina 67, and the holes 75' are through holes, their blind bottom having been removed.

In a step 220', the photoresist is removed from the holes 75', so that the elementary ducts 75 are obtained.

In a step 221', a complete polymerization, called "post-bake" by those acquainted with the sector art, is performed of the structural layer 107.

In a step 226', the sacrificial layer 31 is removed. In this second embodiment, an electrolytic process as described in the already quoted patent applications TO 99A 000610 and TO 99A 000987 may be used for the purpose, as the dice are still joined in the wafer 60, and the equipotential surface constituted by the conducting layer 26 is accordingly available. The cavities left empty by the sacrificial layer come to form the chambers 74 and the connecting channels 68.

In a step 223' etching of the protective layer 30 of $Si_3N_4$ and SiC in correspondence with the soldering pads is performed.

In a step 224', the wafer 60 is cut into the single dice 61 by means of the diamond wheel.

Finally, in a step 227' the finishing operations, known to those acquainted with the sector art, are performed:

- soldering of a flat cable on the die 61 in a TAB (Tape Automatic Bonding) process, for the purpose of forming a subassembly;
- mounting of the subassembly on the container of the head 40;
- filling with ink 142;
- testing of the finished head 40.

What is claimed is:

1. Process for manufacturing a thermal ink jet printhead comprising a tank suitable for containing ink, comprising steps of:

- providing a wafer comprising a plurality of dice, each of which includes a substrate and a plurality of resistors, said dice having an upper face and a lower face;
- making elementary blind holes through said upper face, in correspondence with each of said resistors;
- etching a first part of a groove in said substrate on said lower face of each of said dice, said groove being intended for conveying said ink of said tank;
- applying a first layer of positive photoresist on said upper face of each of said dice, and obtaining a plurality of cavities on said first layer of positive photoresist, each of said cavities being in correspondence with each of said resistors and having a shape that covers the corresponding resistor and at least one of said elementary holes;
- depositing a plurality of sacrificial layers inside each of said cavities;
- applying a second layer of positive photoresist on said upper face of each of said dice and on said sacrificial layers;
- producing from said second layer of positive photoresist a plurality of casts, each of said casts being adherent to each of said sacrificial layers and having an outer face;
- applying a structural layer on said upper face of each of said dice, on said sacrificial layers and on said casts, said structural layer having an outer surface co-planar with said outer face of said casts;
- etching a second part of said groove in said substrate on said lower face of each of said dice, until said elementary holes are reached and rendered through-holes;
- removing said positive photoresist from said elementary holes—separating said dice;
- removing said casts; and
- removing said sacrificial layers.

2. Process according to claim 1, wherein said steps of depositing a plurality of sacrificial layers (31) on each of said dice (61); and of etching a second part of said groove (45) are carried out by means of electrochemical processes.

3. Process according to claim 2, wherein said steps of depositing a plurality of sacrificial layers on each of said dice; and of etching a second part of said groove use as the electrode a conducting layer, which forms a single network connected on the inside of each of said dice.

4. Process according to claim 3, wherein said conducting layer forms a single network connected between at least two different ones of said dice.

5. Process according to claim 4, wherein said conducting layer forms a single network connected between all of said dice belonging to said wafer (60).

6. Process according to claim 1, wherein said sacrificial layers are made of metal.

7. Process according to claim 1, wherein said step of applying a second layer of positive photoresist is conducted using a first PDMS mould.

8. Process according to claim 7, wherein said step of applying a second layer of positive photoresist is carried out by capillarity.

9. Process according to claim 1, wherein said step of applying a structural layer is conducted using a second PDMS mould.

10. Process according to claim 9, wherein said step of applying a structural layer is carried out by capillarity.

11. Process according to claim 1, wherein said step of applying a second layer of positive photoresist and said step of applying a structural layer are conducted using a single PDMS mould.

12. Process for manufacturing a thermal ink jet printhead (40) comprising a tank suitable for containing ink (142), comprising the steps of:

providing a wafer comprising a plurality of dice, each of which includes a substrate and a plurality of resistors, said dice (61) having an upper face and a lower face;

making elementary blind holes through said upper face, in correspondence with each of said resistors;

etching a first part of a groove in said substrate on said lower face of each of said dice (61), said groove (45) being intended for conveying said ink (142) of said tank (103);

applying a first layer of positive photoresist on said upper face of each of said dice, and obtaining a plurality of cavities on said first layer of positive photoresist, each of said cavities being in correspondence with each of said resistors and having a shape that covers the corresponding resistor and at least one of said elementary holes;

depositing a plurality of sacrificial layers inside each of said cavities;

applying a second layer of positive photoresist on said upper face of each of said dice and on said sacrificial layers;

producing from said second layer of positive photoresist a plurality of casts, each of said casts being adherent to each of said sacrificial layers (31) and having an outer face;

applying a structural layer on said upper face of each of said dice, on said sacrificial layers and on said casts, said structural layer having an outer surface co-planar with said outer face of said casts;

removing said casts;

etching a second part of said groove in said substrate on said lower face of each of said dice, until said elementary holes are reached and rendered through-holes;

removing said positive photoresist from said elementary holes;

removing said sacrificial layers; and separating said dice.

13. Process according to claim 12, wherein said steps of (206) depositing a plurality of sacrificial layers (31) on each of said dice (61);

etching a second part of said groove; and removing said plurality of sacrificial layers are carried out by means of electrochemical processes.

14. Process according to claim 13, wherein said steps of (206) depositing a plurality of sacrificial layers (31) on each of said dice (61);

etching a second part of said groove; and removing said plurality of sacrificial layers use as the electrode a conducting layer, which forms a single network connected on the inside of each of said dice.

15. Process according to claim 14, wherein said conducting layer forms a single network connected between at least two different ones of said dice.

16. Process according to claim 15, wherein said conducting layer forms a single network connected between all of said dice belonging to said wafer (60).

17. Process according to claim 12, wherein said sacrificial layers are made of metal.

18. Process according to claim 12, wherein said step of applying a second layer of positive photoresist is conducted using a first PDMS mould.

19. Process according to claim 18, wherein said step of applying a second layer of positive photoresist is carried out by capillarity.

20. Process according to claim 12, wherein said step of applying a structural layer is carried out using a second PDMS mould.

21. Process according to claim 20, wherein said step of applying a structural layer is carried out by capillarity.

22. Process according to claim 12, wherein said step of applying a second layer of positive photoresist and said step of applying a structural layer are carried out by means of a single PDMS mould.

* * * * *